(12) United States Patent
Haddab et al.

(10) Patent No.: US 7,847,536 B2
(45) Date of Patent: Dec. 7, 2010

(54) HALL SENSOR WITH TEMPERATURE DRIFT CONTROL

(75) Inventors: Youcef Haddab, Paris (FR); Alexandre Kerlain, Antony (FR); Vincent Mosser, Le Plessis Robinson (FR); Hartman Van Wyk, Mont Louis sur Loire (FR)

(73) Assignee: Itron, Inc., Liberty Lake, WA (US)

( * ) Notice: Subject to any disclaimer, the term of this patent is extended or adjusted under 35 U.S.C. 154(b) by 0 days.

(21) Appl. No.: 11/897,019

(22) Filed: Aug. 28, 2007

(65) Prior Publication Data

US 2008/0088298 A1 Apr. 17, 2008

Related U.S. Application Data

(60) Provisional application No. 60/841,632, filed on Aug. 31, 2006.

(51) Int. Cl.
*G01R 33/07* (2006.01)
(52) U.S. Cl. .................... 324/117 H; 324/126
(58) Field of Classification Search ............ 324/117 H, 324/158.1, 117 R, 126
See application file for complete search history.

(56) References Cited

U.S. PATENT DOCUMENTS

| 4,160,950 | A | * | 7/1979 | Houldsworth | ................ 324/107 |
| 4,435,653 | A | * | 3/1984 | Matui et al. | ................. 327/511 |
| 4,464,629 | A | * | 8/1984 | Tanaka et al. | .................... 330/6 |
| 4,704,575 | A | * | 11/1987 | Arnoux et al. | ........... 324/117 H |
| 4,799,062 | A | | 1/1989 | Sanderford, Jr. et al. | |
| 4,977,577 | A | | 12/1990 | Arthur et al. | |
| 4,998,102 | A | | 3/1991 | Wyler et al. | |
| 5,065,088 | A | * | 11/1991 | Habiro et al. | ........... 324/117 H |

(Continued)

OTHER PUBLICATIONS

Rainer Kyburz, Jurg Schmid, Radoivje S. Popovic and Hans Melchior "Highly Sensitive In0.53Ga0.47As/InP Hall Sensors Grown by MOVPE" IEEE Transactions of Electron Devices, vol. 41, No. 3, Mar. 1994—pp. 315-320.*

(Continued)

*Primary Examiner*—Ha Tran T Nguyen
*Assistant Examiner*—Richard Isla Rodas
(74) *Attorney, Agent, or Firm*—Dority & Manning, P.A.

(57) ABSTRACT

Disclosed are apparatus and methodology for providing approaches to remove or reduce thermal drift of the magnetic sensitivity of Hall sensor devices, to improve the stability of resulting signals of interest. Samples of a particular signal or signals of interest having improved stability make for advantageous use in conjunction with electricity meters. At the same time, associated designs and related components have greater simplicity, for reduced complexity in implementation. Among alternative embodiments, a gating structure selected of various present alternative designs may be used to partially cover, to an intentionally selected degree, an active area of a Hall sensor, so that a zero-drift supply current value may likewise be selected so as to satisfy other criteria which may be applicable to use of the Hall sensor. In other alternative embodiments, a gate structure is used which fully covers the Hall sensor active area, but a gate-control technique is practiced which is based on combined use with an external, relatively high resistance voltage-divider circuitry arrangement, again for eliminating temperature-based drift of the magnetic sensitivity of the Hall sensor arrangement, regardless of the end use to which such Hall sensor is applied.

11 Claims, 6 Drawing Sheets

U.S. PATENT DOCUMENTS

| | | | |
|---|---|---|---|
| 5,067,136 A | 11/1991 | Arthur et al. | |
| 5,095,493 A | 3/1992 | Arthur et al. | |
| 5,119,396 A | 6/1992 | Snderford, Jr. | |
| 5,198,796 A | 3/1993 | Hessling, Jr. | |
| 5,265,120 A | 11/1993 | Sanderford, Jr. | |
| 5,310,075 A | 5/1994 | Wyler | |
| 5,311,541 A | 5/1994 | Sanderford, Jr. | |
| 5,377,222 A | 12/1994 | Sanderford, Jr. | |
| 5,377,232 A | 12/1994 | Davidov et al. | |
| 5,457,713 A | 10/1995 | Sanderford, Jr. et al. | |
| 5,486,805 A | 1/1996 | Mak | |
| 5,554,927 A * | 9/1996 | Maruyama | 324/117 H |
| 5,570,034 A * | 10/1996 | Needham et al. | 324/763 |
| 5,598,427 A | 1/1997 | Arthur et al. | |
| 5,604,768 A | 2/1997 | Fulton | |
| 5,626,755 A | 5/1997 | Keyser et al. | |
| 5,661,750 A | 8/1997 | Fulton | |
| 5,668,828 A | 9/1997 | Sanderford, Jr. et al. | |
| 5,694,103 A * | 12/1997 | Goodwin et al. | 336/178 |
| 5,696,441 A | 12/1997 | Mak et al. | |
| RE35,829 E | 6/1998 | Sanderford, Jr. | |
| 5,818,225 A * | 10/1998 | Miekley et al. | 324/251 |
| 5,920,589 A | 7/1999 | Rouquette et al. | |
| 5,926,531 A | 7/1999 | Petite | |
| 5,933,072 A | 8/1999 | Kelley | |
| 5,953,368 A | 9/1999 | Sanderford et al. | |
| 5,987,058 A | 11/1999 | Sanderford et al. | |
| 6,028,522 A | 2/2000 | Petite | |
| 6,031,883 A | 2/2000 | Sanderford, Jr. et al. | |
| 6,044,062 A | 3/2000 | Brownrigg et al. | |
| 6,047,016 A | 4/2000 | Ramberg et al. | |
| 6,100,816 A | 8/2000 | Moore | |
| 6,163,276 A | 12/2000 | Irving et al. | |
| 6,178,197 B1 | 1/2001 | Froelich et al. | |
| 6,181,258 B1 | 1/2001 | Summers et al. | |
| 6,195,018 B1 | 2/2001 | Ragle et al. | |
| 6,218,953 B1 | 4/2001 | Petite | |
| 6,232,885 B1 | 5/2001 | Ridenour et al. | |
| 6,233,327 B1 | 5/2001 | Petite | |
| 6,246,677 B1 | 6/2001 | Nap et al. | |
| 6,249,516 B1 | 6/2001 | Brownrigg et al. | |
| 6,263,009 B1 | 7/2001 | Ramberg et al. | |
| 6,335,953 B1 | 1/2002 | Sanderford, Jr. et al. | |
| 6,363,057 B1 | 3/2002 | Ardalan et al. | |
| 6,369,769 B1 | 4/2002 | Nap et al. | |
| 6,377,609 B1 | 4/2002 | Brennan, Jr. | |
| 6,396,839 B1 | 5/2002 | Ardalan et al. | |
| 6,424,270 B1 | 7/2002 | Ali | |
| 6,426,027 B1 | 7/2002 | Scarborough, III et al. | |
| 6,430,268 B1 | 8/2002 | Petite | |
| 6,437,692 B1 | 8/2002 | Petite et al. | |
| 6,452,986 B1 | 9/2002 | Luxford et al. | |
| 6,456,644 B1 | 9/2002 | Ramberg et al. | |
| 6,538,577 B1 | 3/2003 | Ehrke et al. | |
| 6,555,997 B1 * | 4/2003 | De Vries et al. | 324/74 |
| 6,604,434 B1 | 8/2003 | Hamilton et al. | |
| 6,612,188 B2 | 9/2003 | Hamilton | |
| 6,617,879 B1 | 9/2003 | Chung | |
| 6,617,976 B2 | 9/2003 | Walden et al. | |
| 6,617,978 B2 | 9/2003 | Ridenour et al. | |
| 6,618,578 B1 | 9/2003 | Petite | |
| 6,626,048 B1 | 9/2003 | Dam Es et al. | |
| 6,628,114 B2 * | 9/2003 | Lancaster et al. | 324/117 R |
| 6,628,764 B1 | 9/2003 | Petite | |
| 6,630,882 B1 * | 10/2003 | Heremans et al. | 338/32 H |
| 6,639,939 B1 | 10/2003 | Naden et al. | |
| 6,650,249 B2 | 11/2003 | Meyer et al. | |
| 6,657,552 B2 | 12/2003 | Belski et al. | |
| 6,671,586 B2 | 12/2003 | David et al. | |
| 6,700,902 B1 | 3/2004 | Meyer | |
| 6,704,301 B2 | 3/2004 | Chari et al. | |
| 6,727,684 B2 * | 4/2004 | Hatanaka | 324/117 H |
| 6,734,663 B2 | 5/2004 | Fye et al. | |
| 6,747,557 B1 | 6/2004 | Petite et al. | |
| 6,747,981 B2 | 6/2004 | Ardalan et al. | |
| 6,778,099 B1 | 8/2004 | Meyer et al. | |
| 6,784,807 B2 | 8/2004 | Petite et al. | |
| 6,803,638 B2 * | 10/2004 | Takatsuka | 257/422 |
| 6,816,538 B2 | 11/2004 | Shuey et al. | |
| 6,836,108 B1 | 12/2004 | Balko et al. | |
| 6,836,737 B2 | 12/2004 | Petite et al. | |
| 6,850,197 B2 | 2/2005 | Paun | |
| 6,859,186 B2 | 2/2005 | Lizalek et al. | |
| 6,862,498 B2 | 3/2005 | David et al. | |
| 6,867,707 B1 | 3/2005 | Kelley et al. | |
| 6,885,309 B1 | 4/2005 | Van Heteren | |
| 6,891,838 B1 | 5/2005 | Petite et al. | |
| 6,900,737 B1 | 5/2005 | Ardalan et al. | |
| 6,914,533 B2 | 7/2005 | Petite | |
| 6,914,893 B2 | 7/2005 | Petite | |
| 6,918,311 B2 | 7/2005 | Nathan | |
| 6,931,445 B2 | 8/2005 | Davis | |
| 6,940,396 B2 | 9/2005 | Hammond et al. | |
| 6,965,575 B2 | 11/2005 | Srikrishna et al. | |
| 6,972,555 B2 | 12/2005 | Balko et al. | |
| 6,982,651 B2 | 1/2006 | Fischer | |
| 7,046,682 B2 | 5/2006 | Carpenter et al. | |
| 7,053,600 B2 * | 5/2006 | Takabatake | 324/117 H |
| 7,054,271 B2 | 5/2006 | Brownrigg et al. | |
| 7,103,511 B2 | 9/2006 | Petite | |
| 7,126,494 B2 | 10/2006 | Ardalan et al. | |
| 2002/0019725 A1 | 2/2002 | Petite | |
| 2002/0146985 A1 | 10/2002 | Naden | |
| 2002/0169643 A1 | 11/2002 | Petite et al. | |
| 2003/0006753 A1 * | 1/2003 | Lancaster et al. | 324/117 R |
| 2003/0048199 A1 | 3/2003 | Zigdon et al. | |
| 2003/0063723 A1 | 4/2003 | Booth et al. | |
| 2003/0078029 A1 | 4/2003 | Petite | |
| 2003/0093484 A1 | 5/2003 | Petite | |
| 2003/0103486 A1 | 6/2003 | Salt et al. | |
| 2003/0179149 A1 | 9/2003 | Savage et al. | |
| 2004/0004555 A1 | 1/2004 | Martin | |
| 2004/0008663 A1 | 1/2004 | Srikrishna et al. | |
| 2004/0040368 A1 | 3/2004 | Guckenberger et al. | |
| 2004/0053639 A1 | 3/2004 | Petite et al. | |
| 2004/0061623 A1 | 4/2004 | Tootoonian Mashhad et al. | |
| 2004/0062224 A1 | 4/2004 | Brownrigg et al. | |
| 2004/0085928 A1 | 5/2004 | Chari et al. | |
| 2004/0088083 A1 | 5/2004 | Davis et al. | |
| 2004/0131125 A1 | 7/2004 | Sanderford, Jr. et al. | |
| 2004/0183687 A1 | 9/2004 | Petite et al. | |
| 2004/0192415 A1 | 9/2004 | Luglio et al. | |
| 2004/0218616 A1 | 11/2004 | Ardalan et al. | |
| 2004/0264379 A1 | 12/2004 | Srikrishna et al. | |
| 2004/0264435 A1 | 12/2004 | Chari et al. | |
| 2005/0024235 A1 | 2/2005 | Shuey et al. | |
| 2005/0030199 A1 | 2/2005 | Petite et al. | |
| 2005/0036487 A1 | 2/2005 | Srikrishna | |
| 2005/0043059 A1 | 2/2005 | Petite et al. | |
| 2005/0043860 A1 | 2/2005 | Petite | |
| 2005/0052290 A1 | 3/2005 | Naden et al. | |
| 2005/0052328 A1 | 3/2005 | De Angelis | |
| 2005/0068970 A1 | 3/2005 | Srikrishna et al. | |
| 2005/0074015 A1 | 4/2005 | Chari et al. | |
| 2005/0129005 A1 | 6/2005 | Srikrishna et al. | |
| 2005/0147097 A1 | 7/2005 | Chari et al. | |
| 2005/0163144 A1 | 7/2005 | Srikrishna et al. | |
| 2005/0169020 A1 | 8/2005 | Knill | |
| 2005/0171696 A1 | 8/2005 | Naden et al. | |
| 2005/0172024 A1 | 8/2005 | Cheifot et al. | |
| 2005/0190055 A1 | 9/2005 | Petite | |
| 2005/0195768 A1 | 9/2005 | Petite et al. | |
| 2005/0195775 A1 | 9/2005 | Petite et al. | |
| 2005/0201397 A1 | 9/2005 | Petite | |

| | | | | | |
|---|---|---|---|---|---|
| 2005/0218873 | A1 | 10/2005 | Shuey et al. | 2006/0038548 A1 2/2006 Shuey |
| 2005/0226179 | A1 | 10/2005 | Behroozi | 2006/0043961 A1 3/2006 Loy |
| 2005/0243867 | A1 | 11/2005 | Petite | 2006/0071810 A1 4/2006 Scoggins et al. |
| 2005/0251401 | A1 | 11/2005 | Shuey | 2006/0071812 A1 4/2006 Mason, Jr. et al. |
| 2005/0251403 | A1 | 11/2005 | Shuey | |
| 2005/0271006 | A1 | 12/2005 | Chari et al. | |
| 2005/0278440 | A1 | 12/2005 | Scoggins | |
| 2006/0002350 | A1 | 1/2006 | Behroozi | |
| 2006/0012935 | A1 | 1/2006 | Murphy | |
| 2006/0018303 | A1 | 1/2006 | Sugiarto et al. | |

OTHER PUBLICATIONS

International Search Report for PCT International Application No. PCT/US07/19042 dated Aug. 14, 2008.

* cited by examiner

HALL SENSOR WITH TEMPERATURE DRIFT CONTROL

CROSS REFERENCE TO RELATED APPLICATIONS

This application claims priority under 35 USC 119(e) of Provisional Patent Application Ser. No. 60/841,632 filed Aug. 31, 2006, entitled "HALL SENSOR TEMPERATURE DRIFT CONTROL," which is hereby incorporated by reference in its entirety.

FIELD OF THE INVENTION

The present technology relates to utility meters. More particularly, the present technology relates to methodologies and corresponding apparatus for improved controlling of temperature drift in Hall sensors, such as may be associated with electricity utility meters.

BACKGROUND OF THE INVENTION

The general object of metrology is to monitor one or more selected physical phenomena to permit a record of monitored events. Such basic purpose of metrology can be applied to a variety of metering devices used in a number of contexts. One broad area of measurement relates, for example, to utility meters. Such role may also specifically include, in such context, the monitoring of the consumption or production of a variety of forms of energy or other commodities, for example, including but not limited to, electricity, water, gas, or oil.

More particularly concerning electricity meters, mechanical forms of registers were historically used for outputting accumulated electricity consumption data. Such an approach provided a relatively dependable field device, especially for the basic or relatively lower level task of simply monitoring accumulated kilowatt-hour consumption. Such basic mechanical form of register was typically limited in its mode of output, so that only a very basic or lower level metrology function was achieved. Subsequently, electronic forms of metrology devices began to be introduced, to permit relatively higher levels of monitoring, involving different forms and modes of data.

In the context of electricity meters specifically, for a variety of management and billing purposes, it has become desirable to obtain more sophisticated usage data. Solid state devices provided on printed circuit boards, for example, utilizing programmable integrated circuit components, have provided effective tools for implementing many of such higher level monitoring functions desired in the electricity meter context. In addition to the beneficial introduction of electronic forms of metrology, a variety of electronic registers have been introduced with certain advantages. Still further, other forms of data output have been introduced and are beneficial for certain applications, including wired transmissions, data output via radio frequency transmission, pulse output of data, and telephone line connection via such as modems and/or wireless (such as cellular) linkups.

The advent of such variety and alternatives has often required utility companies to provide data collection mechanisms wherein appropriate data may be collected in environments that are increasingly hostile to such data collection. For example, electrical noise emanating from sources near electricity meter sensing functions may constitute a source of error in collected data. Likewise, different types of metering and/or monitoring components may have various thermal sensitivities, accounting for which may become more problematic as the complexity of associated circuitry and thermal environment fluctuations increase.

Electricity meters typically include input circuitry for receiving voltage and current signals or levels at the electrical service. Input circuitry of whatever type or specific design for receiving the electrical service current signals is referred to herein generally as current acquisition circuitry, while input circuitry of whatever type or design for receiving the electrical service voltage signals is referred to herein generally as voltage acquisition circuitry. There are additional issues related to the measurement of voltage and current that present their own problems. One such problem relates to the stability and reliability of the measured quantities during operation over a dynamic range of conditions, including ranging thermal conditions. Under more or less normal operational conditions, thermal conditions may vary significantly, and for a variety of reasons. Due to such fact, it can be difficult to use simple, reliable approaches for accommodating and/or compensating for, or otherwise preventing deleterious measurement effects due to, varying thermal conditions.

Hall sensors are generally known and often used to measure magnetic fields in a wide variety of applications such as in position sensing, contactless current sensing, and in electricity metering. In general, and as is well known to those of ordinary skill in the art, a Hall sensor is a device with at least four contacting electrodes. When biased with a current ($I_{bias}$) through two of such electrodes, a Hall sensor delivers between its other two electrodes a voltage that is proportional both to the component of the magnetic field perpendicular to the current trajectory, and to the value of the biasing current ($I_{bias}$).

It is a common practice that many Hall sensors are fabricated using thin-film technologies, at least in some respects similar to techniques and technologies as used with semiconductor processing. However, because of changes in electron population in the active area of such sensors, the magnetic sensitivities of such Hall sensors tends to be temperature dependent.

In view of the foregoing, it is desired to provide a metrology technology that permits the collection of accurate data regardless of the environment in which the metrology device is installed, and irrespective of the load under which the supply source operates, i.e., to provide a metrology device which is universally applicable with respect to environment, particularly as to a varying thermal environment. In the instance of an electricity meter which makes use of Hall sensor technology, it is desired to provide method and apparatus for controlling the sensitivity temperature drift of such Hall sensor technology at any current bias ($I_{bias}$) chosen therefore.

While various aspects and alternative embodiments may be known in the field of utility metering, no one design has emerged that generally encompasses the above-referenced characteristics and other desirable features associated with utility metering technology as herein presented.

SUMMARY OF THE INVENTION

In view of the recognized features encountered in the prior art and addressed by the present subject matter, an improved apparatus and corresponding methodology for filtering temperature-dependent characteristics and/or variations from collected data signals has been provided.

In a broader present object, methodology and corresponding apparatus are provided for reducing or removing the effects of temperature from sensed signals of interest.

In one of its simpler forms, the present technology advantageously provides control of temperature-related effects which might otherwise cause signal error in the form of signal drift in a sensed signal of interest.

Another advantageous aspect of the present signal filtering subject matter is that it may be provided by reliable techniques yet utilizing a minimal number of components while improving the thermal drift of the magnetic sensitivity of a Hall sensor.

Yet another more specific object of the present technology is to provide method and apparatus resulting in a nulling effect on the thermal drift of the magnetic sensitivity of a Hall sensor when operating in conjunction with an otherwise desired biasing current value.

Another present object of the subject technology is to improve the reliability and stability of the magnetic sensitivity of Hall sensor technology, so that use of such improved Hall sensor technology in the context of electricity metering produces correspondingly more reliable and more stable metrology data based on the sensing outputs of such improved Hall sensor technology.

One present exemplary embodiment relates to a Hall sensor, comprising a planar semiconductive material having, respectively, a central magnetic field responsive active area portion and outer perimeter portions; a plurality of electrical contacts coupled to the outer perimeter portions; and a gate electrode coupled to and covering at least a fractional portion of the central magnetic field responsive active area portion, so that thermal drift characteristics of the Hall sensor may be compensated. Additional present embodiments of such type may involve such an exemplary Hall sensor further combined with the input of a meter, for example, such as an electricity meter.

Another present exemplary embodiment relates to a Hall sensor, comprising a planar semiconductive material having, respectively, a central magnetic field responsive active area portion and outer perimeter portions; a plurality of electrical contacts coupled to the outer perimeter portions; a gate electrode coupled to and covering such central magnetic field responsive active area portion; and a gate control external to the planar semiconductive material, so that thermal drift characteristics may be compensated. Likewise, additional present embodiments of such type may involve such an exemplary Hall sensor further combined with the input of a meter, for example, such as an electricity meter.

Still further present exemplary embodiments equally relate to subject methodology. One example of such a present methodology relates to a method for providing a Hall sensor with improved thermal drift characteristics, comprising: providing a planar semiconductive material having a central magnetic field responsive active area portion and outer perimeter portions; coupling a plurality of electrical contacts to the outer perimeter portions; covering at least a portion of the central magnetic field responsive active area portion with a gate electrode coupled; providing a gate current supply; coupling the gate electrode to the gate current supply; selecting a desired operating bias current value for the Hall sensor; and varying effective gate electrode characteristics, whereby thermal drift characteristics of the Hall sensor may be at least substantially annulled. Optionally, such methodology may further include providing from such Hall sensor an output connected to the input of a meter, for example, such as an electricity meter.

Still further present exemplary embodiments equally relate to subject methodology. One example of such a present methodology relates to a method for providing a Hall sensor with improved thermal drift characteristics, comprising: providing a planar semiconductive material having a central magnetic field responsive active area portion and outer perimeter portions; coupling a plurality of electrical contacts to the outer perimeter portions; covering at least a portion of the central magnetic field responsive active area portion with a gate electrode coupled; providing a gate current supply; coupling the gate electrode to the gate current supply; selecting a desired operating bias current value for the Hall sensor; and varying effective gate electrode characteristics, whereby thermal drift characteristics of the Hall sensor may be at least substantially annulled. Optionally, such methodology may further include providing from such Hall sensor an output connected to the input of a meter, for example, such as an electricity meter.

Additional objects and advantages of the present subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments and uses of the present subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents including combinations of features, parts, or steps or configurations thereof not expressly shown in the figures or stated in the detailed description of such figures.

Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
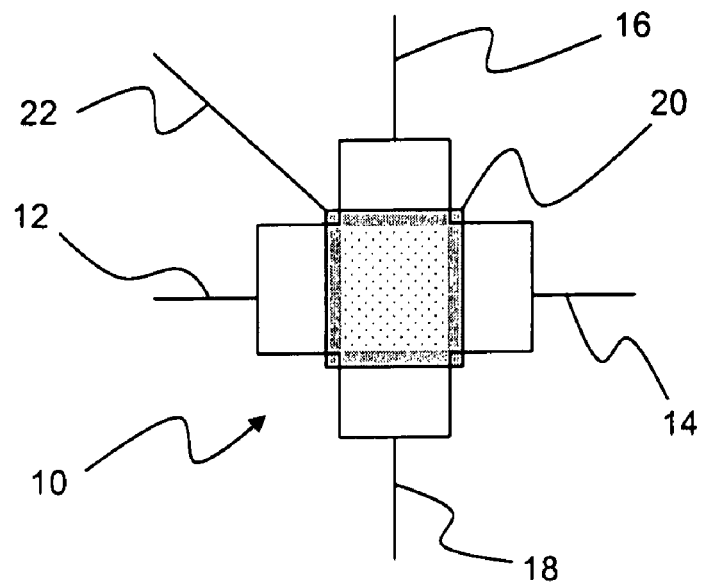
FIG. 1 illustrates a previously known configuration of a Hall sensor wherein a gate is provided over the active area of the Hall sensor.

Repeat use of reference characters throughout the present specification and appended drawings is intended to represent same or analogous features, elements, or steps of the present subject matter.

DETAILED DESCRIPTION OF THE PREFERRED EMBODIMENTS

As discussed in the Summary of the Invention section, the present subject matter is particularly concerned with corresponding methodology and apparatus for improving thermal drift characteristics for the magnetic sensitivity of Hall sensor devices and, in particular, for annulling the thermal drift for a desired biasing current value used with such Hall sensor devices, for the overall improvement of a measured or sensed particular signal of interest, such as used for example in conjunction with an electricity meter.

Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Moreover, it should be appreciated that, whereas the general discussion herein relates more specifically to electricity meters using specific sensor types including Hall effect sensors, such particular combined use of the Hall effect sensor technology is not a limitation of the present technology. In general the present technology may be applied to any use or application of Hall sensors, where elimination or reduction of thermal drift of the magnetic sensitivity of the Hall sensor device may be desirable.

Reference will now be made in detail to presently preferred embodiments of the subject corresponding methodology and apparatus for improving thermal drift of magnetic sensitivity of a Hall sensor, including additional background discussion of prior Hall sensor technology for further contrast thereof with the present subject matter.

Most Hall sensors are planar devices, i.e., the conduction of the electrons occurs in a very thin plane parallel to the surface of the semiconductor device. As known to those of ordinary skill in the art, a Hall sensor typically is a device with at least four contacting electrodes. In such configurations, the biasing current is applied between two opposite contact electrodes and the Hall voltage is measured between two other electrodes on each side of the current path. Information on preferred Hall device shapes and contact locations is well known, such as in the well known textbook "Hall Effect Devices, Second Edition" (ISBN 0750308559) by R. S. Popovic.

As is also well known to those of ordinary skill in the art, the output of a Hall sensor for various voltage biasing conditions reads:

$$V_H = G \mu_n \cdot V_{bias} \cdot B_z$$

where G denotes a geometric coefficient related to the aspect ratio (width/length) of the Hall sensor, $\mu_n$ is the electron mobility, and B is the magnetic induction to be measured.

Since the electron mobility $\mu_n$ is known to always have a relatively large temperature variation, voltage biasing should be avoided when one wants to obtain precision magnetic measurements. Therefore, it is understood by those of ordinary skill in the art that the preferred implementation for precision magnetic measurements is controlled current biasing ($I_{bias}$) conditions, for which the voltage output of a Hall sensor is known to read:

$$V_H = K_H \cdot I_{bias} \cdot B_z$$

where $K_H$ denotes the so-called cross-sensitivity.

The cross-sensitivity $K_H$ is related to $n_s$, the sheet electron concentration in the current channel at the location between the Hall contacts, by:

$$K_H = 1/e\, n_s$$

where e is the electron charge.

Practically, the temperature dependence of $n_s$, and hence of $K_H$, can be made lower than a few 100 ppm/° C. for a particular design of the device parameters. Using, for example, a stabilized biasing current $I_{bias}$, the absolute magnetic sensitivity is represented by:

$$V_H/B_z = K_H I_{bias}$$

Such absolute magnetic sensitivity will show a thermal drift amounting to the same amount as that of the cross-sensitivity $K_H$. However, for some applications, such remaining thermal drift is still too high as compared to the desired or required measurement precision specifications in the considered temperature range. However, practice of the subject matter otherwise presently disclosed will, in contrast, provide improvement of the thermal drift of the magnetic sensitivity of a Hall sensor, and more peculiarly a method for annulling the thermal drift for a desired biasing current value.

One previously known method for seeking to control the remaining thermal drift of the magnetic sensitivity is to implement a metal gate over the active area of the sensor and adjust the value of the control gate voltage as a function of temperature in order to compensate for the thermal drift of the electron population in the active area. The intended result is a constant magnetic sensitivity over temperature variations. Such a methodology has been mentioned previously in the scientific literature. See, for example, R. Kyburz, J. Schmid, R. S. Popovic, H. Melchior, "*High Performance InGaAs/InP Hall Sensors With Low Temperature Coefficient of the Sensitivity*", ESSDERC 93 Proceedings, 655-658 (1993).

FIG. 1 illustrates such a previously known configuration of a Hall sensor generally 10, having four representative contacting electrodes generally 12, 14, 16, and 18, wherein a gate generally 20 is provided over the active area of the Hall sensor 10. In practicing such a method with such a Hall sensor configuration, the method requires knowledge of the carrier concentration behavior versus temperature as well as ambient temperature measurement data. In addition, there must be provided an external feedback circuit (not shown in FIG. 1) used for correspondingly adjusting (that is, fine tuning) the gate voltage (applied with representative element 22) as a function of the ambient temperature data. Therefore, such known method is relatively complicated, apparatus intensive, and somewhat cumbersome to implement.

Figure 2:
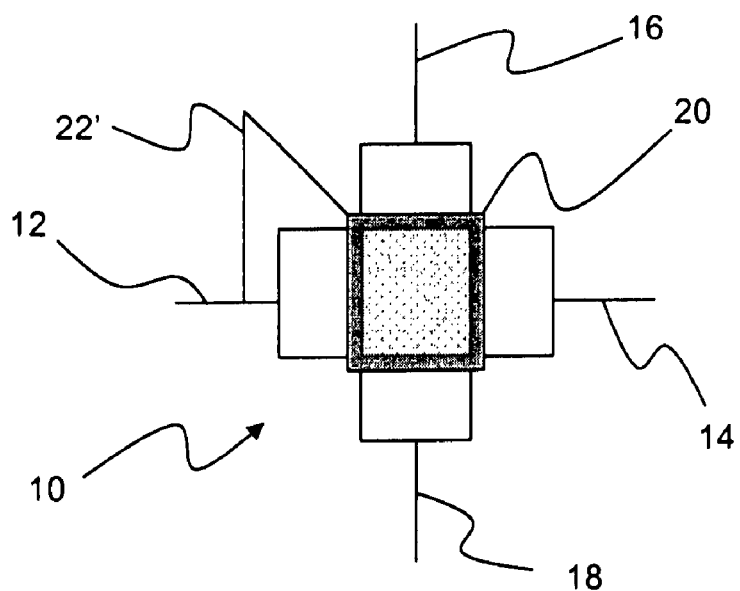
FIG. 2 illustrates a previously known configuration of a Hall sensor wherein a gate is provided over the active area of the Hall sensor, and wherein such gate is connected to a low voltage input of the Hall sensor or Hall cell.

FIG. 2 illustrates a previously known configuration of a Hall sensor generally 10, wherein a gate generally 20 is provided over the active area of the Hall sensor, and wherein in accordance with an alternative prior methodology, such gate 20 is connected via element 22 to a low voltage input (generally 12) of the Hall sensor or Hall cell 10. Such previously known gate-control technique amounts to a self-biasing of the gate 20 at the "Low" voltage of the Hall sensor 10. Such technique allows a good control of the sensitivity versus temperature without the need of an external biasing circuit. In FET-like devices, this can be written as:

$$\frac{1}{K_H} \approx \left(V_G - V_T - \frac{V_{DS}}{2}\right)$$

Where $V_G$ is the gate voltage, $V_T$ an equivalent threshold voltage, and $V_{DS}$ the voltage drop across the Hall sensor, with $$V_{DS} = R_{in} \times I_{bias}$$

where $R_{in}$ is the Hall sensor input resistance. By tying the gate to the low voltage input of the Hall cell, there is a specific value of current for which the temperature dependence of ($V_G$-$V_{DS}$/2) cancels out the temperature dependence of $V_T$. This is represented by the "Fully gated sensor" curve in FIG. 5A.

The prior technique represented in conjunction with FIG. 2 provides a relatively good control of sensitivity versus temperature without the need of an external biasing circuit (that is, the portion of the circuitry represented by the free end of element 22 of FIG. 1). However, one limitation of such alternative technique is that it establishes or sets a unique supply current for which the magnetic sensitivity is temperature independent. Such zero-drift current value is inherently determined by the physical properties of the device and cannot be chosen independently.

Figure 3A:
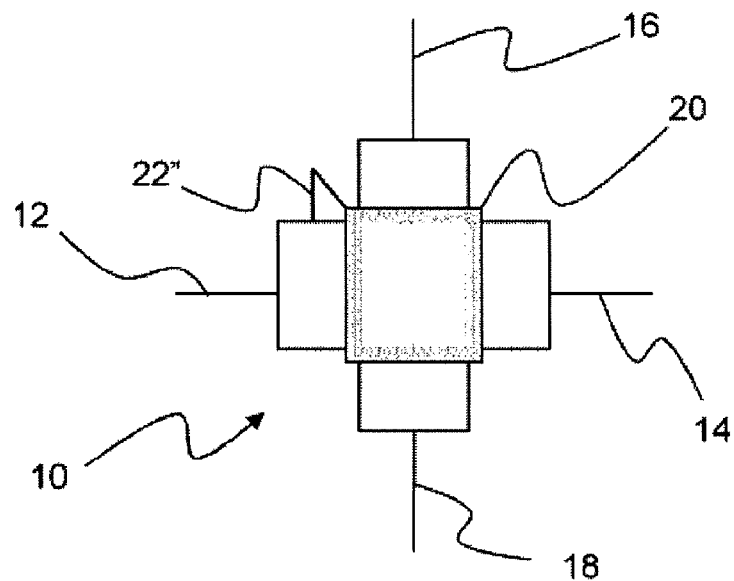
FIG. 3A illustrates a configuration of a Hall sensor wherein a gate is provided over the active area of the Hall sensor, and wherein such gate is connected in a particular manner to a low voltage input of the Hall sensor or Hall cell.
Figure 3B:
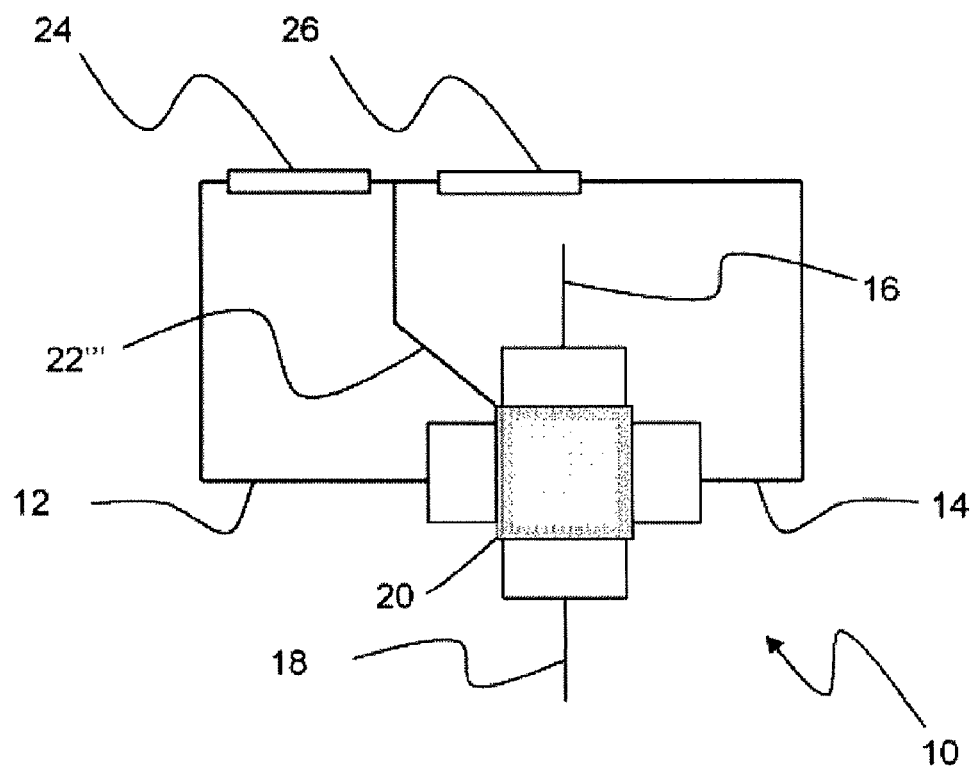
FIG. 3B illustrates a configuration of a Hall sensor wherein a gate is provided over the active area of the Hall sensor, and wherein such gate is connected in a particular manner to a voltage divider circuit which is directly associated with the Hall sensor or Hall cell and fabricated to the extent possible from the same material as the Hall device.

Such limitation on the established zero-drift supply current value is a drawback because it may not be the best choice when considering other properties or requirements of the sensor. For example, it has been found that such value may be about 70 microampere for Hall sensors if used in certain electricity meter configurations, and such value may be contrary to other needs of such configuration (for example, too low). Efforts have been made to overcome such drawback of the limited bias current approach. Present FIGS. 3A and 3B are intended to represent several of such attempted solutions. FIG. 3A illustrates a configuration of a Hall sensor generally 10 wherein a gate generally 20 is provided over the active area of the Hall sensor 10, and wherein such gate 20 is connected in a particular manner relative to a low voltage input generally 12 of the Hall sensor or Hall cell 10. More specifically, instead of connecting the gate at the "Low" contact (the "Source" if using field-effect transistor (FET) terminology), FIG. 3A shows such connection being made at an intermediate point of the channel. In other words, the connection is made at some intermediate position between the Source and the Hall sensor arm, as represented by present FIG. 3A.

In such an arrangement as in present FIG. 3A, the zero-drift current value advantageously will be higher than when otherwise contacting the gate to the Source. However, such an arrangement requires an extra contact, which might destroy the balance of the Hall sensor and create or result in accuracy problems.

Representative of another attempt to address such drawback of the limited bias current approach, FIG. 3B illustrates a configuration of a Hall sensor generally 10 wherein a gate generally 20 is provided over the active area of the Hall sensor 10, and wherein such gate 20 is connected in a particular manner to a voltage divider circuit which is directly associated via element 22 with the Hall sensor or Hall cell 10, and which is fabricated to the extent possible from the same material as the Hall device 10. More specifically, the resistors 24 and 26 are used relative to input side connections 12 and 14 of Hall sensor 10 in a manner well understood by those of ordinary skill in the art, to create a bias input for gate 22. To avoid or limit the effects of differential reactions to changing thermal conditions, the material for the separate resistors 24 and 26 of the circuitry illustrated is made in the same material as that of the Hall sensor 10. By such an approach to biasing gate 22, the overall thermal drift of the magnetic sensitivity of the Hall sensor generally 10 may be improved, but such approach clearly increases the complexity of the configuration and its associated implementation.

Therefore, while the two methodologies represented by present FIGS. 3A and 3B provide a relatively acceptable level of improvement to the thermal drift characteristics of an associated Hall sensor device, they create the drawback of increased overall complexity of the resulting Hall device.

In accordance with present technology, a methodology has been developed whereby the effect imparted by a gate electrode may be varied to annul thermal effects within the Hall sensor. In some embodiments of the present subject matter, the gating effect may be varied by physically varying the gate electrode. In other embodiments the gating effect may be varied by varying the control voltage applied to the gate electrode. In further embodiments, combinations of the first and second embodiments may be employed.

Figure 4:
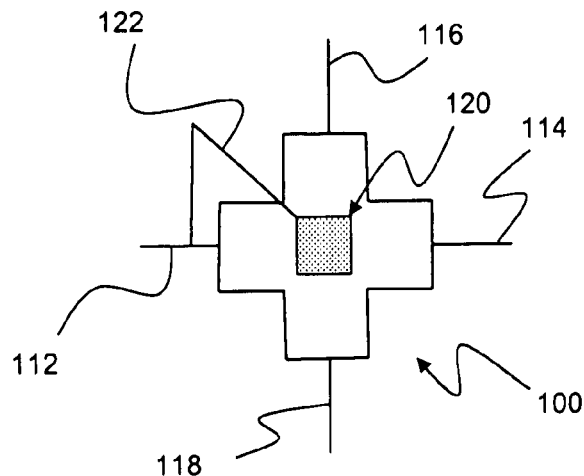
FIG. 4 illustrates an exemplary embodiment of a configuration of a Hall sensor provided in accordance with the present subject matter, and wherein a gate is provided per present subject matter over only a portion of the active area or zone of the Hall sensor or cell, and wherein a particular implementation of control for such gate is provided in accordance with the present subject matter.

FIG. 4 illustrates an exemplary embodiment of a configuration of a Hall sensor generally 100 provided in accordance with the present subject matter, and wherein a gate generally 120 is provided per present subject matter over only a portion of the active area at the center of the Hall sensor or cell 100 cross, and wherein a particular implementation of control for such gate is provided per element 122 in accordance with the present subject matter. The exemplary embodiment of present FIG. 4 makes use of a gate-control technique that amounts to a self-biasing of the gate 120 associated with the low voltage input generally 112 of the Hall sensor 100. While incorporating such particular gate-control technique, the gate control is itself in an overall combination with a gate 120 that is fundamentally different from the gate 20 of present FIG. 2. As a result, the FIG. 4 illustrated embodiment in accordance with the present subject matter is free from the limitation on the drift canceling bias current value that is a substantial drawback to the prior approach represented by such FIG. 2. In addition, the present subject matter of FIG. 4 results in the advantage of relatively more simple and robust implementation.

In comparison with the gate 20 of the FIG. 2 prior configuration, the present subject matter of FIG. 4 makes use instead of a gate 120 which may be thought of from one perspective as a partial gate, i.e., a gate 120 covering only a fractional portion of the active area at the relative center of the crossed elements forming the Hall device, as represented in such present FIG. 4.

Figure 5A:
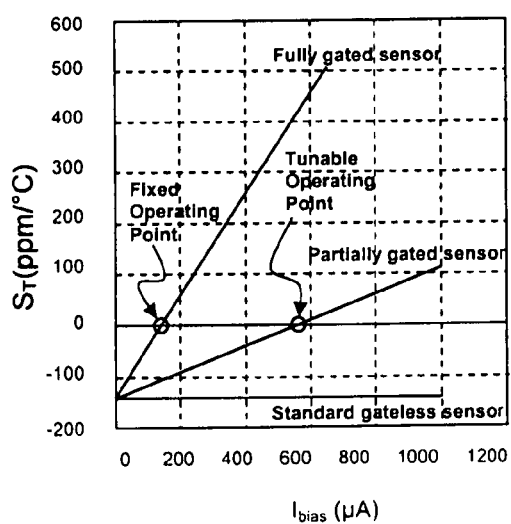
FIG. 5A illustrates a graph referenced in conjunction with explaining relationships between biasing currents and temperature sensitivities of Hall sensor configurations provided in accordance with the present subject matter versus previously known Hall sensor configurations.
Figure 5B:
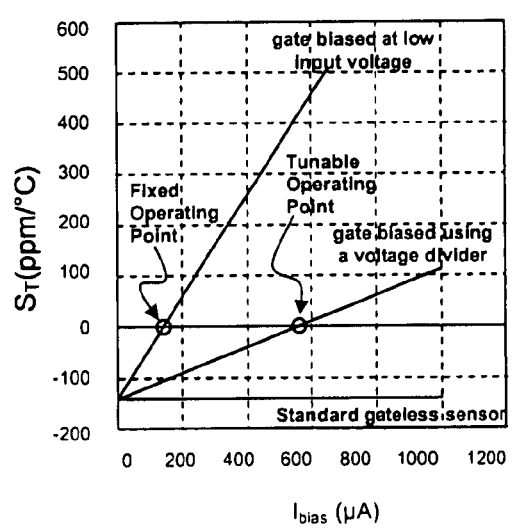
FIG. 5B illustrates a graph similar to that of FIG. 5A showing that, in accordance with present subject matter, substantially identical results as those represented by present FIG. 5A may be obtained through adjustments to the gate bias.

The graphs of present FIGS. 5A and 5B assist to illustrate pertinent present aspects of temperature sensitivity control for present versus prior Hall sensor configurations. As represented in such FIG. 5A graph, temperature sensitivity $S_T$ is displayed in units of PPM (parts per million) per degree Centigrade versus operating bias current $I_{bias}$ in units of microamperes. For clarity, the three response lines shown on the graph of present FIG. 5 are not additionally labeled with numbers but are with descriptions.

Those of ordinary skill in the art will understand that one of the response lines of FIG. 5A (labeled "Standard gateless sensor") has no slope while two of such lines do have a slope. The line without any slope has a single intersection point on the vertical axis, which is a number offset from zero (in this instance, significantly below zero). While the other two lines do have a slope, one (labeled "Fully gated sensor") has a slope in this instance much higher than the other (labeled "Partially gated sensor").

The graphic illustrations of present FIG. 5A represent that a standard (that is, prior art) gateless Hall sensor can be operated at any bias current $I_{bias}$, but with no control over $S_T$. In comparison, a Hall sensor gated in accordance with the prior art (that is, a "Fully gated sensor" but without other features in accordance with the present subject matter) has a single operating bias current $I_{bias}$ for which $S_T=0$. In contrast with both such prior art arrangements, an arrangement in accordance with at least one exemplary embodiment of the present subject matter (in other words, a "Partially-gated" Hall sensor) will also have a single operating point for which $S_T=0$, but such value advantageously corresponds to a relatively higher bias current $I_{bias}$ than that of the above-referenced "Fully gated sensor."

As an additional feature in accordance with the present subject matter, such bias current $I_{bias}$ operating point of the present "Partially gated" Hall sensor embodiments can advantageously be chosen (that is, specified) by tuning the fraction of the active area that is gated. Therefore, the descriptive language included on present FIG. 5A reflects that "Partially gated" Hall sensor embodiments in accordance with the present subject matter have a "Tunable operating point" while the prior art arrangements of the "Fully gated sensor" approach have a "Fixed operating point."

In such present "Partially gated" Hall sensor embodiments, the overall temperature dependence of the Hall sensor is now the average of the gated and ungated zones. Changing by design the fraction of gate coverage, the unique zero-thermal-drift supply current can therefore be set as desired, or as needed for a particular embodiment or set of design criteria. Therefore, in accordance with present apparatus and methodology, those of ordinary skill in the art practicing the present subject matter may now first determine and select a supply current optimized per the overall needs of the implementation, and then subsequently adjust or tune the coverage size of the gate surface over and relative to the active area of the Hall sensor, in order to have a magnetic sensitivity that is independent of temperature, even while operating at the optimum supply current. Therefore, the present methodology and corresponding apparatus has the advantage of simplicity over prior methods (that is, no extra components or circuits required), even if for the same or similar final results.

Figure 7A:
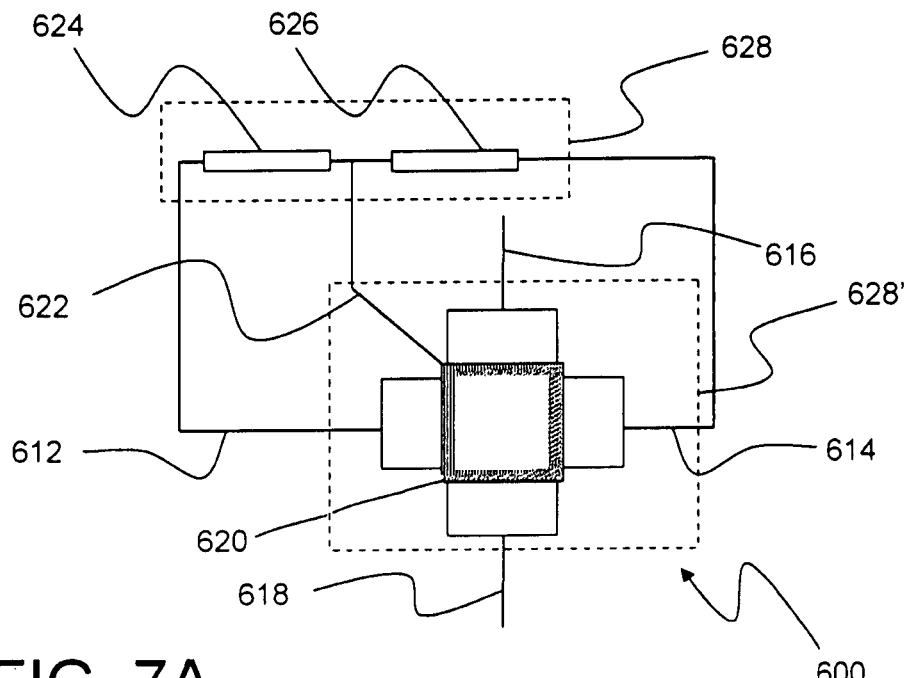
FIG. 7A illustrates a configuration incorporating a Hall sensor in accordance with the present subject matter, wherein a gate is provided over the active area of the Hall sensor, and wherein a particular implementation of control for such gate is provided in accordance with the present subject matter in conjunction with external voltage divider circuitry.

With reference now to FIGS. 5B and 7A, a second embodiment of the present subject matter will be described. As may be seen from a comparison of FIGS. 5A and 5B, the illustrated curves are substantially identical with the exception of notations. Where, for example, in FIG. 5A, one of the curves is labeled "Fully gated sensor," a corresponding curve in FIG. 5B is labeled "gate biased at low input voltage. Likewise, the curve labeled "Partially gated sensor" in FIG. 5A finds its corresponding curve in FIG. 5B listed as "gate biased using a voltage divider." The illustration of such two Figures shows that substantially the same results may be obtained for the two embodiments of the present subject matter by employing slightly different techniques for arriving at the same effective operating point.

In other words, the first embodiment of the present subject matter provides a tunable operating point based on adjustments in the coverage area of the gating electrode. In the second embodiment of the present subject matter, the coverage area of the gating electrode may be fixed and the voltage applied may be varied to achieve a preselected tunable operating point. Of importance to the second method, however, is the source of the voltage applied to the gating electrode, as will be explained more fully with reference to FIG. 7A. It should, of course, be appreciated by those of ordinary skill in the art that a combination of the first and second embodiments could be provided so that fine tuning of individual sensors could be achieved by a combination of voltage adjustment and gating electrode trimming.

FIGS. 6A through 6D illustrate various exemplary configurations of Hall sensors provided in accordance with the present subject matter, and wherein respective gates are provided in accordance with respective alternative embodiments per present subject matter over only a portion of the active area or zone of the Hall sensor or cell, and wherein a particular implementation of control for such gate is provided in accordance with the present subject matter. As in FIG. 4, corresponding aspects (albeit different in part from the prior art to present embodiments) are shown by reference characters which use their own hundred-series designation, as will be understood by those of ordinary skill in the art. While reference characters for FIG. 4 were the hundred series, FIGS. 6A through 6D are the two hundred series through five hundred series, respectively. Similarly, FIGS. 7A and 7B reference characters are the six hundred series and seven hundred series, respectively. In view of the foregoing, repetitive discussion of reference characters is reduced for the convenience of the reader.

Figure 6A:
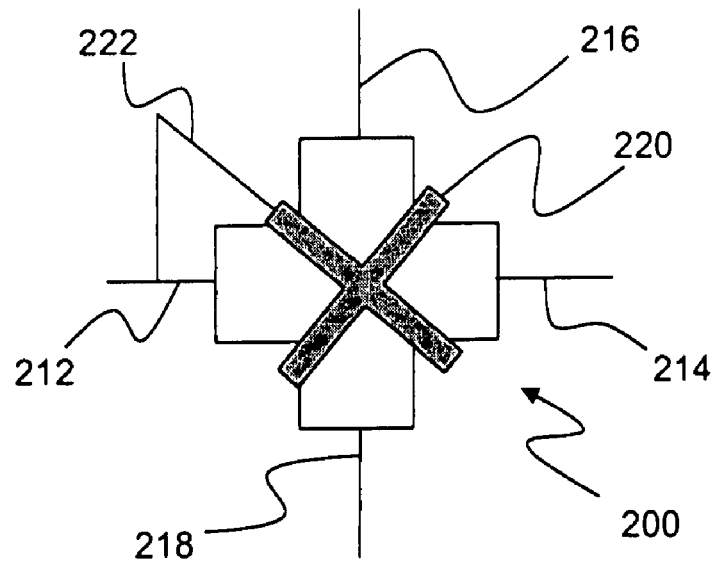
FIG. 6A illustrates a configuration of a Hall sensor provided in accordance with the present subject matter, and wherein a gate is provided in accordance with an alternative embodiment per present subject matter over only a portion of the active area or zone of the Hall sensor or cell, and wherein a particular implementation of control for such gate is provided in accordance with the present subject matter.
Figure 6B:
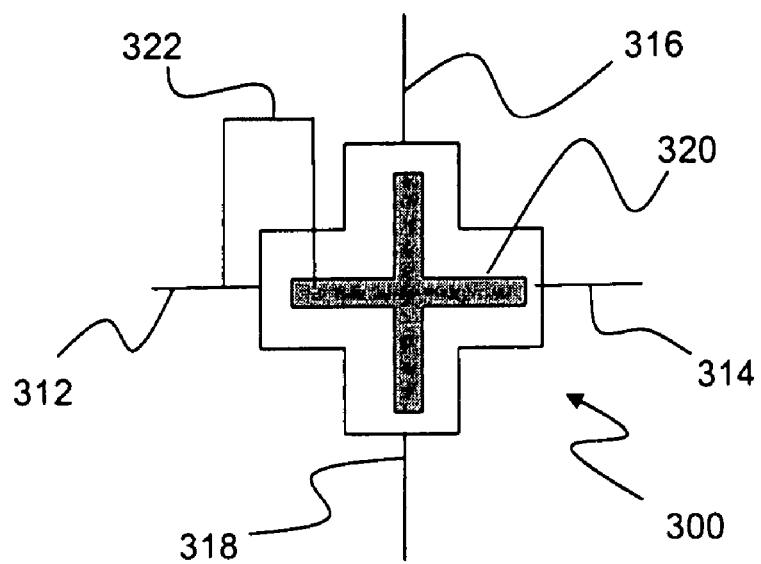
FIG. 6B illustrates a configuration of a Hall sensor provided in accordance with the present subject matter, and wherein a gate is provided in accordance with another alternative embodiment per present subject matter over only a portion of the active area or zone of the Hall sensor or cell, and wherein a particular implementation of control for such gate is provided in accordance with the present subject matter.
Figure 6C:
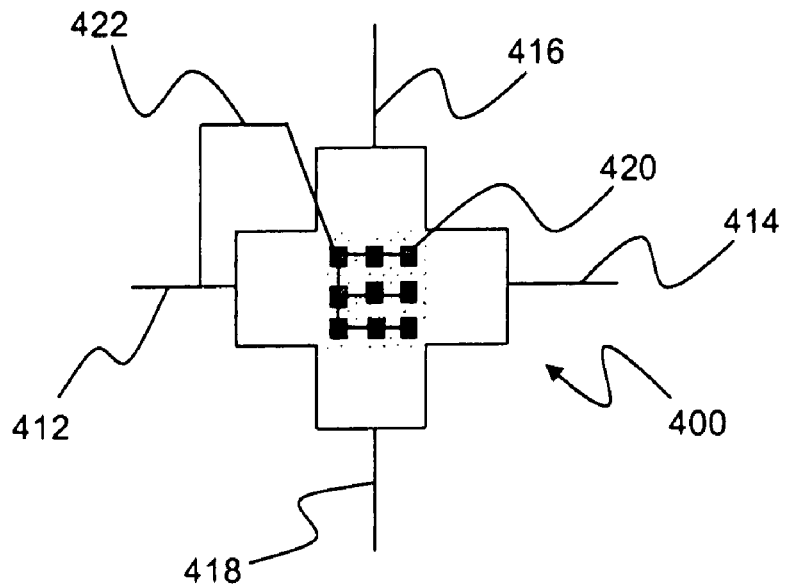
FIG. 6C illustrates a configuration of a Hall sensor provided in accordance with the present subject matter, and wherein a gate is provided in accordance with yet another alternative embodiment per present subject matter over only a portion of the active area or zone of the Hall sensor or cell, and wherein a particular implementation of control for such gate is provided in accordance with the present subject matter.
Figure 6D:
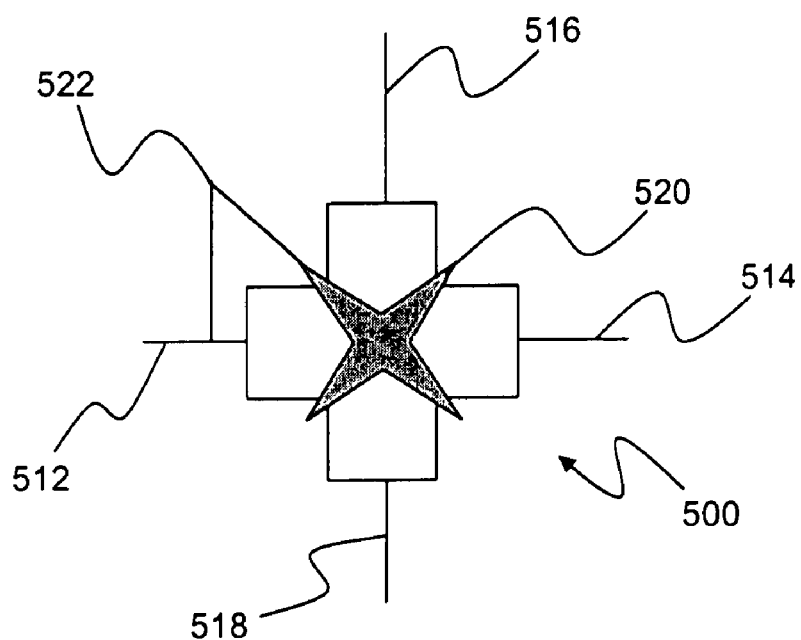
FIG. 6D illustrates a configuration of a Hall sensor provided in accordance with the present subject matter, and wherein a gate is provided in accordance with yet still another alternative embodiment per present subject matter over only a portion of the active area or zone of the Hall sensor or cell, and wherein a particular implementation of control for such gate is provided in accordance with the present subject matter.

In the exemplary embodiment of present FIG. 6A, gate 220 has an alternative shape in the form of the letter "X", or that of a cross-shape which is partially rotated in top view, such as by about 45 degrees. In the exemplary embodiment of present FIG. 6B, gate 320 is cross-shaped, and, overlapping with the generally cross-shaped active area or region portion of Hall device generally 300. However, as illustrated, gate 320 is generally smaller that the cross-shaped active area of Hall device 300, so that that gate only partially covers such active area, in keeping with the features of the present embodiments also represented in present FIGS. 4 and 6A. In the exemplary embodiment of present FIG. 6C, gate 420 assumes yet another alternative shape in accordance with the present subject matter. In this instance, such gate 420 assumes several or plural, additionally partial gate components, collectively only partially covering the active area of Hall device 400 (again in accordance with such present exemplary embodiments). In the exemplary embodiment of present FIG. 6D, gate 520 assumes yet still another alternative shape in accordance with the present subject matter, although still generally cross-shaped as in FIGS. 6A and 6B. In this instance, gate 520 more nearly resembles gate 220 of FIG. 6A but provides a more nearly star or multi-triangular shaped formation, allowing yet still another exemplary variation in active area coverage area.

While the exemplary embodiments of such FIGS. 6A through 6D, respectively, illustrate various optimized gate designs, different variations may be practiced without departing from the spirit and scope of the present disclosure. It is believed, however, that the better performing of such alternative designs per the present subject matter, symmetrical gate designs are preferred, and the active area of the corresponding Hall device should preferably be completely partitioned by the gate component or components.

FIG. 7A illustrates a configuration incorporating a Hall sensor generally 600 in accordance with yet another exemplary embodiment of the present subject matter. In such exemplary arrangement, a gate generally 620 is provided over the entirety of the active area of the Hall sensor 600. However, a particular implementation of control for such gate 620 is provided in accordance with the present subject matter. In accordance with such present subject matter, such gate control is provided in conjunction with external voltage divider circuitry generally 628.

While FIG. 7A makes uses of a gate-control voltage-divider solution somewhat similar to the arrangement of prior FIG. 3B, such present arrangement is nonetheless different from the arrangement in FIG. 3B. For example, the voltage-divider subject matter generally 628 of present FIG. 7A is external to the chip or component within which Hall device 600 (as otherwise illustrated by separate designation of chip 628') is otherwise implemented. Such voltage-divider subject matter generally 628 of present FIG. 7A, having its own resistors 624 and 626, is also a relatively high resistance implementation (at least as compared with the resistors 24 and 26 more directly implemented with Hall sensor 10 in the arrangement of present FIG. 3B).

Such combined present features of present FIG. 7A, inclusive of the use of relatively very high resistances, avoids the constraint or drawback of the prior art of attempting to establish the same temperature coefficient for the voltage-divider circuitry as that of the Hall cell resistance. The resulting high resistance arrangement of present FIG. 7A makes the current flowing through the voltage-divider 628 negligible, and therefore any difference in temperature coefficients is removed as a consideration of any importance.

Figure 7B:
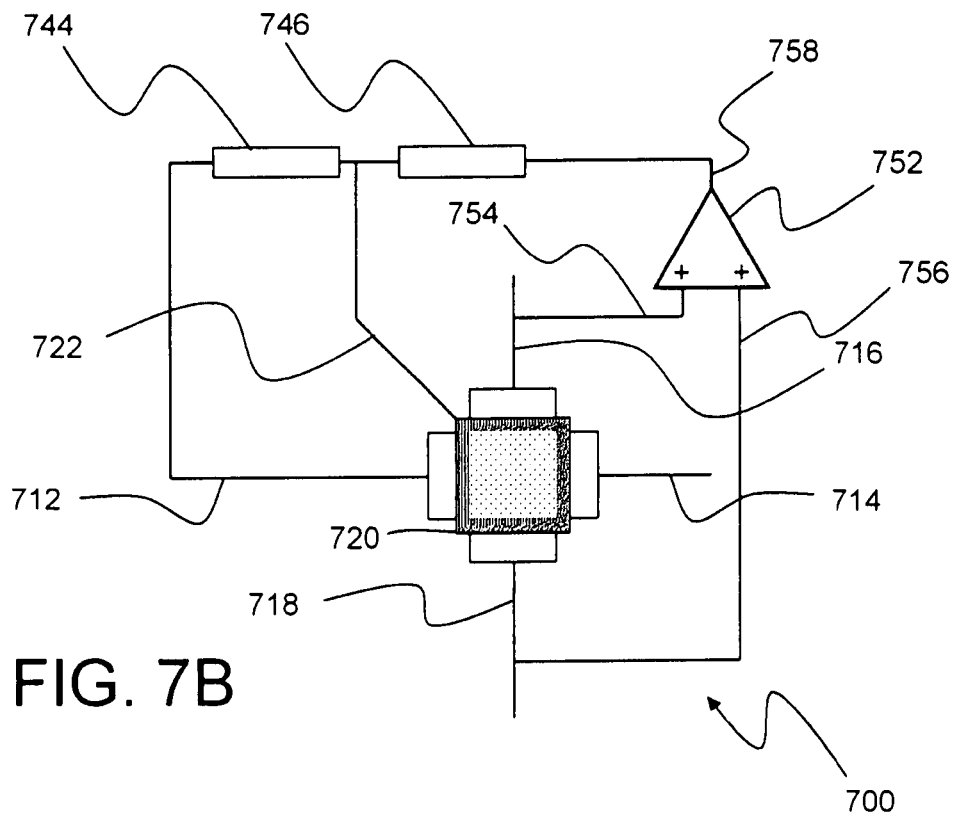
FIG. 7B illustrates a configuration incorporating a Hall sensor in accordance with the present subject matter, wherein a gate is provided over the active area of the Hall sensor, and wherein a particular implementation of control for such gate is provided in accordance with the present subject matter in conjunction with external voltage divider circuitry including common mode amplification.

With reference now to FIG. 7B, a further embodiment of the present subject matter will be described. As may be seen by comparison of FIGS. 7A and 7b the two Hall sensor configurations are substantially similar except for at least two features. The first such feature is readily apparent from the schematic illustrations and corresponds to the inclusion of an amplifier 752. The second feature is less apparent and resides in the fact that in the embodiment of FIG. 7A, resistors 724, 726 forming voltage divider 728 are constructed separately from the Hall sensor while in the embodiment of FIG. 7B resistors 744, 746 may be included on the Hall sensor chip.

With respect to the embodiment of FIG. 7B, it will be appreciated that amplifier 752 is configured to provide a signal at its output line 758 based on a common mode voltage at input terminals 754, 756 derived from the input voltages to the Hall sensor at its terminals 718, 716. An important aspect of such configuration resides in the fact that, with the inclusion of amplifier 752, the device requires no trimming of either the gating electrode or the voltage divider, but rather the adjustment function is automatically carried out by adjustment of the voltage divider input voltage as a result of the common mode operation associated with amplifier 752.

While the present subject matter has been described in detail with respect to specific embodiments thereof, it will be appreciated that those skilled in the art, upon attaining an understanding of the foregoing may readily produce alterations to, variations of, and equivalents to such embodiments. For example, the embodiments illustrated and described with respect to FIGS. 7A and 7B may also be further modified using the techniques disclosed with respect to FIGS. 6A-6D. Further, it should be noted that the technology herein disclosed is not incompatible with known spinning current methodologies used to remove effects of offset and noise in certain Hall sensor configurations. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A Hall sensor with thermal drift control, comprising:
a planar semiconductive material having, respectively, a central magnetic field responsive active area portion and outer perimeter portions;
a plurality of electrical contacts coupled to said outer perimeter portions;
a gate electrode coupled to and covering said central magnetic field responsive active area portion; and
a gate control voltage supply external to said planar semiconductive material, said gate control voltage supply comprising an amplifier having inputs coupled to a pair of said plurality of electrical contacts and having an output responsive to a common mode voltage between said amplifier inputs; a voltage divider having a pair of inputs and an output, one of said pair of voltage divider inputs being coupled to said output of said amplifier, and said output of said voltage divider being coupled to said gate electrode.

2. A Hall sensor as in claim 1, further combined as the input of an electricity meter.

3. A method for providing a Hall sensor with improved thermal drift characteristics, comprising:
providing a planar semiconductive material having a central magnetic field responsive active area portion and outer perimeter portions;
coupling a plurality of electrical contacts to the outer perimeter portions;
covering a portion of the central magnetic field responsive active area portion with a gate electrode such that a geometric center of the gate electrode is located substantially at a geometric center for the Hall sensor,
providing a gate supply voltage;
coupling the gate electrode to the gate supply voltage;
selecting an operating bias current value for the Hall sensor; and
varying effective characteristics of the gate electrode so that thermal drift characteristics of the Hall sensor are substantially annulled when said operating bias current value is applied to the Hall sensor.

4. A method as in claim 3, wherein said method comprises:
providing the gate supply voltage by coupling the gate electrode to one of the plurality of electrical contacts; and
varying effective gate electrode characteristics by varying the portion of the central magnetic field responsive active area portion covered by the gate electrode.

5. A method as in claim 3, wherein said method comprises:
providing the gate supply voltage as an external thermally stable voltage supply; and
varying effective gate electrode characteristics by varying the thermally stable voltage supply.

6. A method as in claim 5, wherein providing the gate supply voltage as a thermally stable voltage supply comprises:
providing a voltage divider; and
thermally isolating the voltage divider from the planar semiconductive material.

7. A method as in claim 3, wherein: providing a gate supply voltage comprises:
providing an amplifier having inputs coupled to a pair of the plurality of electrical contacts and having an output responsive to a common mode voltage between the amplifier inputs;
providing a voltage divider having a pair of inputs and an output; and
coupling one of the pair of inputs of the voltage divider to the output of the amplifier; and further wherein
coupling the gate electrode to the gate current supply comprises coupling the gate electrode to the output of the voltage divider.

8. A method as in claim 7, wherein providing a voltage divider comprises providing a resistive voltage divider.

9. A method as in claim 7, wherein providing a voltage divider comprises providing a voltage divider on the planar semiconductive material.

10. A method as in claim 3, further comprising providing from said Hall sensor an output connected as the input of a meter.

11. A method as in claim 10, wherein the meter is an electricity meter.

* * * * *